(12) United States Patent
Neubert et al.

(10) Patent No.: US 6,974,515 B2
(45) Date of Patent: Dec. 13, 2005

(54) CERAMIC SUBSTRATE AND METHOD OF MANUFACTURING SAME

(75) Inventors: Anja Neubert, Reutlingen (DE); Holger Hoefer, Sonnenbuehl (DE)

(73) Assignee: Robert Bosch GmbH, Stuttgart (DE)

( * ) Notice: Subject to any disclaimer, the term of this patent is extended or adjusted under 35 U.S.C. 154(b) by 94 days.

(21) Appl. No.: 10/352,709

(22) Filed: Jan. 27, 2003

(65) Prior Publication Data

US 2005/0074638 A1   Apr. 7, 2005

(30) Foreign Application Priority Data

Jan. 26, 2002 (DE) .............................. 102 03 024

(51) Int. Cl.⁷ .......................... B32B 31/26; C04B 35/00
(52) U.S. Cl. ............................... 156/89.11; 156/89.12
(58) Field of Search .................. 156/89.11, 89.12; 428/210; 338/42

(56) References Cited

U.S. PATENT DOCUMENTS

| | | | | |
|---|---|---|---|---|
| 3,575,789 A | * | 4/1971 | Siefert et al. | 65/42 |
| 4,382,247 A | * | 5/1983 | Stecher et al. | 338/42 |
| 4,726,921 A | | 2/1988 | Nishigaki et al. | |
| 5,634,999 A | * | 6/1997 | Takeuchi et al. | 156/89.11 |

FOREIGN PATENT DOCUMENTS

JP   8-130160   * 5/1996

* cited by examiner

*Primary Examiner*—Melvin Mayes
(74) *Attorney, Agent, or Firm*—Kenyon & Kenyon

(57) ABSTRACT

A ceramic substrate having a defined curvature and a method of its manufacture are described. For this purpose at least two ceramic layers having different defined temperature coefficients of expansion are positioned on top of one another and are permanently bonded together. A curved ceramic substrate may be advantageously utilized in micro-hybrid technology, in multilayer ceramic technology, or in hybrid technology, e.g., as a membrane element of a piezoresistive pressure sensor element.

3 Claims, 1 Drawing Sheet

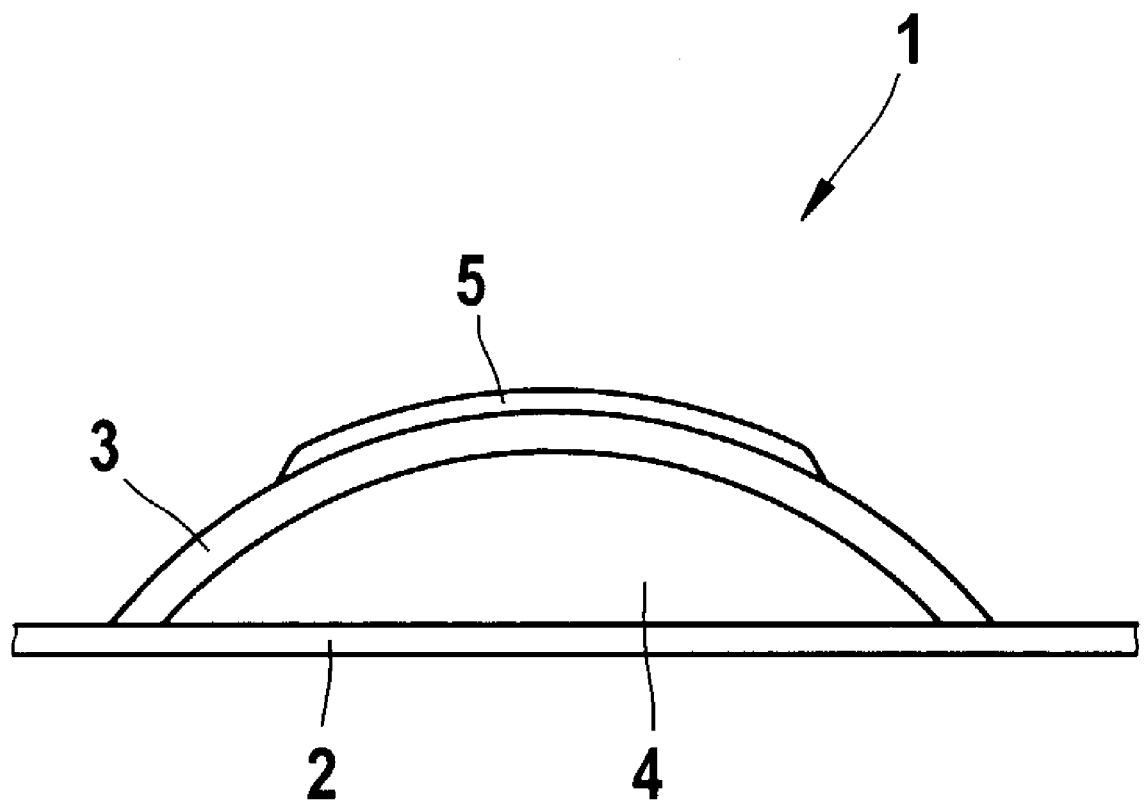

CERAMIC SUBSTRATE AND METHOD OF MANUFACTURING SAME

FIELD OF THE INVENTION

The present invention relates to a ceramic substrate such as is used in micro-hybrid technology.

BACKGROUND INFORMATION

As a rule, such ceramic substrates are formed in several layers. For this purpose, homogeneous tape layers, i.e., tape layers having the same composition, are positioned on top of one another, laminated, and sintered. The tape layers are usually composed of a system of oxide glasses, such as of a mixture of $Al_2O_3$, $SiO_2$, and CaO. These precursor substances of the ceramic substrate are chemically converted during sintering, forming crystalline phases, such as the crystalline silicate anorthite ($CaO.Al2O3.2SiO_2$). In practice, planar multi-layer ceramic substrates are produced that way.

SUMMARY OF THE INVENTION

An object of the present invention is the manufacture of a ceramic substrate having a defined curvature.

In a particularly advantageous application, the ceramic substrate according to the present invention is used as a membrane element of a pressure sensor or of a force sensor having piezoresistive resistors. For this purpose, the curved ceramic substrate according to the present invention is positioned in such a way that the pressure, i.e., the force to be measured, acts against the pre-stress of the ceramic substrate, caused by the curvature. In this application the ceramic substrate according to the present invention is advantageously positioned above a planar assembly surface, so that a cavity is included between the assembly surface and the ceramic substrate. In this case, the assembly surface not only forms a cavity limitation but is also used as a mechanical stop for the ceramic substrate due to its ability to withstand the pressure or force to be measured. An overload of the ceramic substrate is thus prevented. In addition, having such a composition of the sensor element, i.e., a planar carrier and the curved ceramic substrate according to the present invention, excessive stress, which may result in breakage, does not normally occur in the edge areas of the cavity. Since a mold ceramic is not required, such a sensor element having a cavity may be implemented in an easy and cost-effective manner.

Basically there are different possibilities for implementing a ceramic substrate having a defined curvature according to the present invention. In a particularly advantageous variant, at least two ceramic layers, having different but definedly set temperature coefficients of expansion (TCE), are positioned one upon the other and are permanently bonded together, e.g., by sintering. The curvature of the substrate may be very accurately predetermined in this way.

Through specific addition of crystallization nuclei to the precursor substances of the individual ceramic layers, for example, the temperature coefficients of expansion may be easily predetermined. A defined amount of baked ceramic in pulverized form may be simply added to the precursor substances of the individual ceramic layers for this purpose.

In an alternative variant of the method according to the present invention, the temperature coefficients of the individual ceramic layers are predetermined by the choice of the precursor substances and/or the composition of the particular ceramic layer. In this case, ceramic layers which differ considerably in their composition, or even belong to different material systems, are combined with each other in a ceramic substrate, i.e., they are positioned one upon the other and bonded together. Ceramic layers having the precursor substances $Al_2O_3$, PbO, and $B_2O_3$ may be combined for example with ceramic layers formed from precursor substances $Al_2O_3$, $SiO_2$, and CaO. During sintering, the mixture of $Al_2O_3$, PbO, and $B_2O_3$ is converted into crystalline anorthite, gehlenite and/or wollastonite, while the mixture of $Al_2O_3$, $SiO_2$, and CaO is converted into crystalline silicate anorthite during sintering.

BRIEF DESCRIPTION OF THE DRAWING

The FIGURE shows a schematic design of a pressure sensor element including a curved ceramic substrate according to the present invention.

DETAILED DESCRIPTION

Pressure sensor element 1, depicted in the sole FIGURE, includes a planar carrier 2 which is designed to withstand the expected pressure without deformation. Carrier 2 may be formed from metal or from a ceramic substrate, for example. A membrane element 3 in the form of a ceramic substrate having a defined curvature according to the present invention is mounted on planar carrier 2, so that a cavity 4 is situated between carrier 2 and ceramic substrate 3. A circuit 5 is located on the side of ceramic substrate 3 facing away from cavity 4, the circuit including at least one piezoresistive resistor element which may be implemented using screen printing technology. The circuit including the piezoresistive resistor element may also be situated on the side of the ceramic substrate facing the cavity, where it is better protected against external effects.

Pressure sensor element 1 is positioned in such a way that the pressure to be measured acts against the pre-stress of membrane element 3, caused by the curvature, thereby causing a deformation of membrane element 3. The curvature of membrane element 3 changes from a maximum curvature in the initial stage to a minimum curvature at the stop which is formed by carrier 2. Due to the curvature of membrane element 3, the electric resistance of the piezoresistive resistor also changes. The pressure may be easily determined by analyzing this change in resistance, e.g., via a Wheatstone bridge circuit.

The maximum force acting upon such a sensor element 1 depends essentially on the geometry of membrane element 3. The maximum detectable force increases by increasing the thickness and the width, as well as reducing the length of the ceramic. According to its geometric design, sensor element 1 may be used for small and sensitive, or large measuring ranges.

As mentioned above, membrane element 3 is a ceramic substrate according to the present invention having a defined curvature, i.e., pre-stress. It is composed of several layers whose precursor substances in each case are a $Al_2O_3$ powder and a frit which is mainly composed of $Al_2O_3$, $SiO_2$, and CaO.

In order to manufacture such a membrane element, two layers of the precursor substances having minor doping of crystallization nuclei, and two layers of the precursor substances having higher doping of crystallization nuclei are piled on top of each other and are laminated in the described exemplary embodiment. Doping with crystallization nuclei takes place through the addition of baked ceramics in pulverized form. The difference in the doping of the individual layers is preferably on the order of magnitude of up to 0.5 weight percent. The crystallization behavior of the individual layers is determined, among other things, by their doping which is reflected by the process of the crystallization and to a lesser extent by the material composition of the individual layers. In addition, the temperature coefficients of expansion (TCE) of the individual layers are also determined by their doping. Thus, the temperature coefficients of expansion and thus also the differences between the temperature coefficients of expansion of the individual layers (TCE differences) may be specifically set via defined doping. For a difference in the doping amount of up to 0.5 weight percent, a TCE difference of up to $0.3 \cdot 10^{-6}$ 1/K is to be expected.

The chemical conversion of the precursor substances takes place during the subsequent sintering, forming the crystalline silicate anorthite ($CaO.Al_2O_3.2SiO_2$). $Al_2O_3$ and residue of the frits remain in excess. Due to the different temperature coefficients of expansion of the two layers having a minor doping and the two layers having a higher doping of crystallization nuclei, an appropriate curvature of the substrate is established as early as during cooling down after sintering, as in the case of a bimetal. It has been found that the theoretically determined values for the curvature in a 2-layer model agree very well with the experimentally determined values.

After sintering of the ceramic substrate, a printed circuit paste may be applied to the convex surface of the ceramic substrate.

Finally it should be noted, as described above, that utilization as a membrane element in a pressure sensor element represents only an example of the application of a ceramic substrate according to the present invention, and that the present invention is not limited to this utilization.

What is claimed is:

1. A method of manufacturing a ceramic substrate having a body with a defined curvature, comprising:
    positioning at least two ceramic layers having different defined temperature coefficients of expansion on top of one another; and
    permanently bonding together the at least two ceramic layers;
    wherein the temperature coefficients of expansion of the at least two ceramic layers are predefined by specific addition of crystallization nuclei to precursor substances.

2. The method as recited in claim 1, wherein:
    baked ceramic in pulverized form is added as the crystallization nuclei.

3. A method of manufacturing a ceramic substrate having a body with a defined curvature, comprising:
    positioning at least two ceramic layers having different defined temperature coefficients of expansion on top of one another; and
    permanently bonding together the at least two ceramic layers;
    wherein the temperature coefficients of expansion of the at least two ceramic layers are predefined by at least one of a choice of precursor substances and a composition of the at least two ceramic layers,
    a precursor substance of a first ceramic layer of the at least two ceramic layers includes $Al_2O_3$, $PbO$, and $B_2O_3$, and
    a precursor substance of a second ceramic layer of the at least two ceramic layers includes $Al_2O_3$, $SiO_2$, and $CaO$.

* * * * *